United States Patent
Kapil et al.

(10) Patent No.: US 12,341,520 B2
(45) Date of Patent: Jun. 24, 2025

(54) GLITCH REDUCTION IN HIGH-SPEED DIFFERENTIAL RECEIVERS

(71) Applicant: Texas Instruments Incorporated, Dallas, TX (US)

(72) Inventors: Jitender Kapil, Bangalore (IN); Srikanth Vellore Avadhanam Ramamurthy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 18/326,418

(22) Filed: May 31, 2023

(65) Prior Publication Data

US 2024/0405760 A1   Dec. 5, 2024

(51) Int. Cl.
  *H03K 5/1252*   (2006.01)
  *H03K 5/24*    (2006.01)

(52) U.S. Cl.
  CPC ......... *H03K 5/1252* (2013.01); *H03K 5/2481* (2013.01)

(58) Field of Classification Search
  CPC .. H03K 5/1252; H03K 5/2481; H03K 5/1254; H03K 3/013; H03K 17/16; H04B 1/16; H04B 1/22; H04B 1/24; H04B 1/18; H04B 1/06; H04B 1/38; H04B 1/40; H04B 1/44; H04L 25/0292
  See application file for complete search history.

(56) References Cited

U.S. PATENT DOCUMENTS

2004/0099530 A1*  5/2004  Bolz .................. G01N 27/4065
                                                       327/63

OTHER PUBLICATIONS

"THDVD14xx 3.3-V to 5-V RS-485 Transceivers with +/− 18-KV IEC ESD Protection," Datasheet SLLSEY3E (Texas Instruments Incorporated, 2019).
"THVD1424 3-V to 5.5-V RS-485 Transceiver With Slew Rate Control, Integrated 120-Ohm Switchable Termination Resistor and Duplex Switching," Datasheet SLLSFQ4 (Texas Instruments Incorporated, Sep. 2022).
"THVD1454 3-V to 5.5-V RS-485 Transceiver With Slew Rate Control, Integrated 120 Ohm Switchable Termination and Slew Rate Control," Datasheet SLLSFQ5 (Texas Instruments Incorporated, Jan. 2023).

(Continued)

*Primary Examiner* — Jung Kim
(74) *Attorney, Agent, or Firm* — Mandy Barsilai Fernandez; Frank D. Cimino

(57) ABSTRACT

A differential transceiver including a driver circuit and a receiver circuit, and a serial communications network including the transceiver. The receiver circuit includes an input resistor attenuator, having first and second attenuator inputs coupled to the first and second terminals, respectively, a differential comparator having first and second comparator inputs, and an output buffer having an input coupled to the output of the comparator. The receiver circuit further includes a first switch coupling the first attenuator output to the first comparator input, a second switch coupling the second attenuator output to the second comparator input, and a fail-safe circuit including first and second current sources coupled to the first and second comparator inputs, respectively, and third and fourth switches coupled in series between the first and second current sources.

18 Claims, 9 Drawing Sheets

(56) References Cited

OTHER PUBLICATIONS

"RS-422 and RS-485 Standards Overview and System Configurations," Application Report SLLA070D (Texas Instruments Incorporated, 2010).

Stiller, "RS-485 basics: Introduction," Technical article available at https://e2e.ti.com/blogs_/b/analogwire/posts/rs-485-basics-introduction (Texas Instruments Incorporated, 2015).

Griffith, "RS-485 basics: the RS-485 receiver," Technical article available at https://e2e.ti.com/blogs_/b/analogwire/posts/rs-485-basics-the-rs-485-receiver (Texas Instruments Incorporated, 2016).

Griffith, "RS-485 basics: two ways to fail-safe bias your network," Technical article available at https://e2e.ti.com/blogs_/b/industrial_strength/posts/rs-485-basics-two-ways-to-fail-safe-bias-your-network (Texas Instruments Incorporated, 2016).

"THS6222 8 V to 32 V, Differential HPLC Line Driver with Common-Mode Buffer," Datasheet THS6222 (Texas Instruments Incorporated, 2021).

* cited by examiner

GLITCH REDUCTION IN HIGH-SPEED DIFFERENTIAL RECEIVERS

BACKGROUND

This patent application relates to transceiver circuitry for serial data communication, and is more particularly directed to receiver circuitry in such transceivers.

Serial signal interfaces are often used in the communication of data and control signals among electronic devices and modules in industrial applications. Serial communication can provide suitable data rates for many systems over reasonably long distances, while requiring fewer conductors than equivalent parallel signal interfaces.

Various industry standards for serial data communication have been adopted by standards organizations. The RS-485 standard (more formally known as standard EIA-485-A) promulgated by the Telecommunications Industry Association (TIA) and Electronic Industries Alliance (EIA) has been widely adopted. In addition, some higher-level interface standards and protocols specify the RS-485 standard for the physical layer. Other serial communications standards include the RS-422 standard, and various standards utilizing the Low Voltage Differential Signaling ("LVDS") technology.

The RS-485 and RS-422 standards, by way of example, specify asynchronous differential signaling in a half-duplex mode over a two-line bus, and in a full-duplex mode over a four-line bus. From a hardware standpoint, RS-485 and RS-422 interface circuitry is often implemented as transceivers including both a transmitter and a receiver. Multiple transceivers can be connected in parallel to the same bus. Transceivers at the ends of the bus cable can include termination resistors to match the characteristic impedance of the cable. Some transceivers are constructed to operate in either or both of the half-duplex and full-duplex modes. Examples of RS-485 transceivers include the THVD1410, THVD1450, THVD1451, and THVD1452 transceivers available from Texas Instruments Incorporated.

FIG. 1 illustrates prior art receiver circuitry 100 as implemented in an RS-485 serial communications transceiver. Terminals Y and Z of an input differential attenuator 101 receive a differential voltage VOD, for example from a pair of RS-485 bus lines. Differential attenuator 101 includes a resistor ladder that produces or generates an attenuated voltage VID at an output. The resistor divider includes resistors 103 and 106 coupled in series between terminal Y and the output of a common mode buffer 108, and resistors 105 and 107 coupled between terminal Z and the output of the common mode buffer 108. Common mode buffer 108 generates a nominal common mode voltage at a middle node of the resistor divider of attenuator 101 (e.g., resistors 103, 106, 105, 107). For example, common mode buffer 108 may have an input coupled to a resistor divider coupled between power supply or reference voltages (e.g., between a power supply voltage and ground). Capacitors 102 and 104 are coupled in parallel with resistors 103, 105, respectively.

Attenuator 101 develops an attenuated differential input voltage VID at positive and negative inputs of receiver comparator 110. The positive input of receiver comparator 110 is coupled to a node between resistors 103 and 106 of attenuator 110, and the negative input of receiver comparator 110 is coupled to a node between resistors 105 and 107 of attenuator 110. The output of receiver comparator 110 is coupled to the input of receiver output buffer 115. The output of receiver output buffer 115 provides logic level signals at its output RXD, which correspond to the differential bus voltage received at terminals Y and Z. In this prior art receiver circuitry 100, receiver output buffer 115 is enabled by enable signal EN (e.g., at a high logic level) from the output of logic circuitry 120. Logic circuitry 120 has a first input that receives receiver enable signal /RE (the "/" indicating enable is active at a low logic level) and a second input that receives driver enable signal DE.

SUMMARY

According to one example, a receiver circuit includes an attenuator circuit, having first and second inputs and first and second outputs, and includes a resistor network coupled to the first and second inputs and first and second outputs. The receiver circuit further includes a comparator having first and second inputs and an output, and a buffer having an input coupled to the output of the comparator. The receiver circuit further includes a first switch having a first terminal coupled to the first output of the attenuator circuit and a second terminal coupled to the first input of the comparator, a second switch having a first terminal coupled to the second output of the attenuator circuit and a second terminal coupled to the second input of the comparator. A first current source is coupled to the first input of the comparator, and a second current source is coupled to the second input of the comparator. Third and fourth switches are coupled in series between the first and second current sources.

According to another example, a method includes disabling a transmitter of a transceiver and, for an isolation interval after disabling the transmitter, decoupling a comparator of a receiver of the transceiver from outputs of an attenuator of the receiver, and applying a differential voltage at inputs of the comparator. The method further includes, after the isolation interval, coupling the inputs of the comparator to the outputs of the attenuator and removing the differential voltage from the inputs of the comparator.

According to another example, a network includes first and second bus lines, and coupled to those first and second bus lines. A first transceiver of the transceivers includes a transmitter and a receiver circuit, both coupled to the first and second bus lines. The receiver circuit includes an attenuator circuit having first and second inputs and first and second outputs, and including a resistor network coupled to the first and second inputs and the first and second outputs. The receiver circuit also includes a comparator having first and second inputs and an output, and a buffer having an input coupled to the output of the comparator. The receiver circuit further includes a first switch having a first terminal coupled to the first output of the attenuator circuit and a second terminal coupled to the first input of the comparator, and a second switch having a first terminal coupled to the second output of the attenuator circuit and a second terminal coupled to the second input of the comparator. A first current source is coupled to the first input of the comparator, and a second current source is coupled to the second input of the comparator. Third and fourth switches are coupled in series between the first and second current sources, and a resistor is coupled between the third and fourth switches. The receiver further includes control circuitry coupled to the first, second, third, and fourth switches and configured to open the first and second switches and close the third and fourth switches during an isolation interval following disabling of the transmitter, and configured to close the first and second switches and open the third and fourth switches after the isolation interval.

Technical advantages enabled by one or more of these examples include the inhibiting of "glitches" at the receiver output as a consequence of the disabling of a transmitter in a serial communications transceiver.

Other technical advantages enabled by the disclosed examples will be apparent to those of ordinary skill in the art having reference to the following specification together with its drawings.

BRIEF DESCRIPTION OF THE DRAWINGS

The same reference numbers or other reference designators are used in the drawings to illustrate the same or similar (in function and/or structure) features.

DETAILED DESCRIPTION OF EXAMPLE EMBODIMENTS

In half-duplex differential serial signaling, transceivers switch from transmitting differential signals onto the bus to receiving differential signals from the bus. When the transmitter circuitry is disabled in such a switch, coupling from terminals Y and Z to comparator 110 through capacitors 102 and 104, can cause "glitch" in the data state at the output RXD of receiver output buffer 115. It is within this context that the examples described herein arise.

One or more examples are described in this specification as implemented into serial differential transceiver circuitry, for example operable according to the RS-485 standard, as it is contemplated that such implementation is particularly advantageous in that context. However, it is also contemplated that aspects of these examples may be beneficially applied in transceiver circuitry operating according to other communications standards or specifications, and in other signaling applications. Accordingly, the following description is provided by way of example only.

Figure 2:
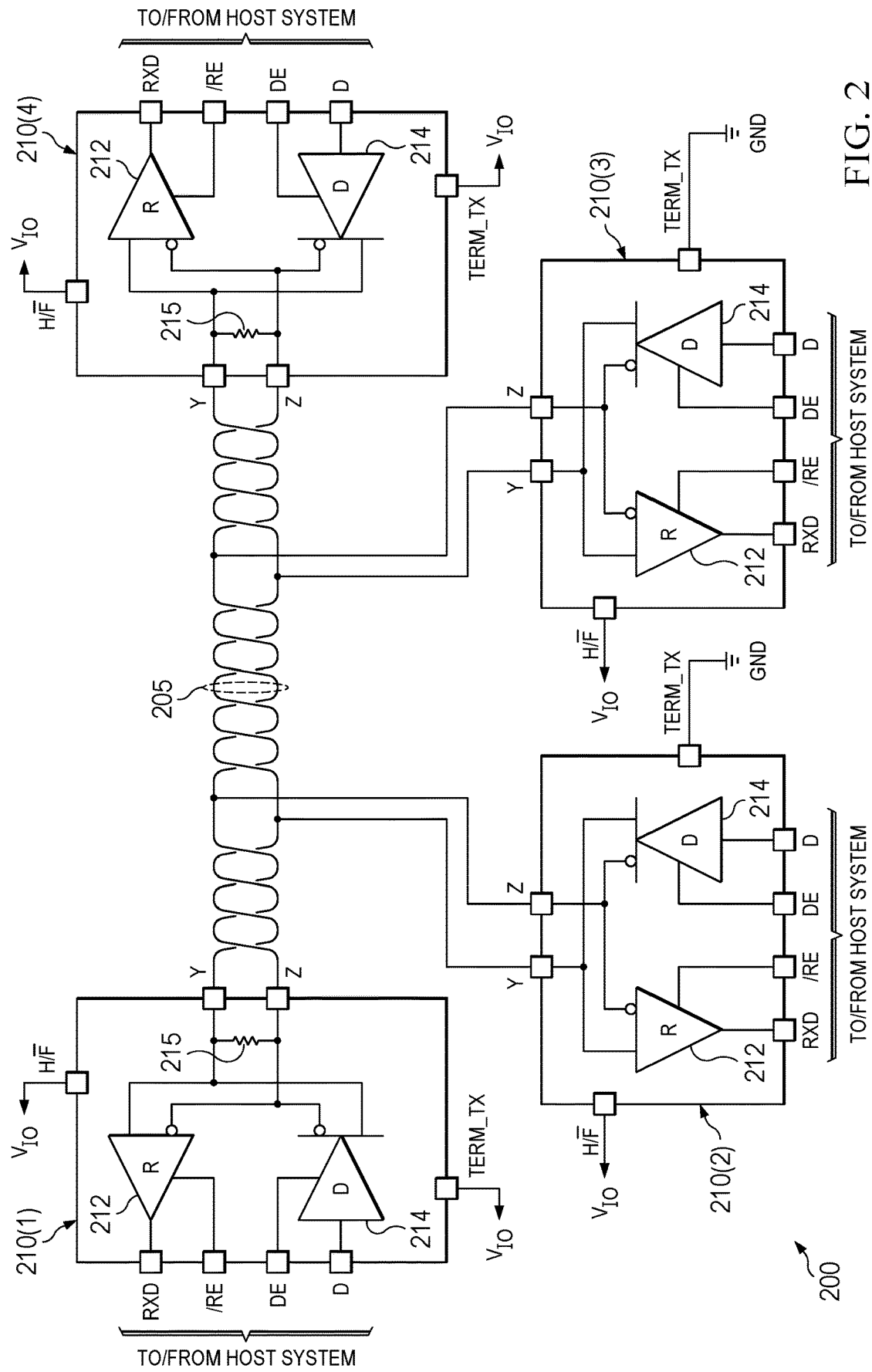
FIG. 2 is an electrical diagram, in block and schematic form, of a serial communications network according to an example.

FIG. 2 illustrates serial communication network 200 in which the described examples may be implemented. Network 200 includes transceivers 210(1) through 210(4) (generically and collectively referred to as transceiver or transceivers 210), each coupled to serial bus 205. Each transceiver 210 in network 200 includes a corresponding instance of receiver 212 and transmitter 214. Each transceiver 210 may be implemented in or coupled to a host system (not shown), such as a computer, a microcontroller-based module such as a sensor or control device, input/output device, network node, or the like.

In this example, transceivers 210 communicate over serial bus 205 in a half-duplex mode, such that each transceiver 210 may be either transmitting or receiving over bus 205 at any point in time, but may not simultaneously transmit and receive. In this example, network 200 implements serial communication over bus 205 according to the RS-485 standard. Other communications standards or other half-duplex serial communication protocols may alternatively be used. In this RS-485 example, serial bus 205 includes two bus lines Y and Z, which are coupled to Y and Z terminals, respectively, at each transceiver 210.

Receiver 212 in each transceiver 210 has differential inputs coupled to transceiver terminals Y, Z, respectively. In this example, terminal Y is coupled to a positive input of receiver 212, and terminal Z is coupled to a negative input. Receiver 212 has an enable input coupled to transceiver terminal /RE, at which transceiver 210 receives a receiver enable signal /RE from the host system. The output of receiver 212 is coupled to transceiver terminal RXD, at which receiver 212 presents received data signals to the host system.

Transmitter 214 in each receiver 210 has an input coupled to transceiver terminal D, at which transmitter 214 receives data to be transmitted from the host system. Transmitter 214 also has an enable input coupled to transceiver terminal DE, at which transceiver 210 receives a driver enable signal from the host system. In this example, transmitter 214 has a differential output coupled to transceiver terminals Y and Z, which are in turn coupled to corresponding bus lines Y and Z of serial bus 205.

Each of transceivers 210 in network 200 has additional terminals that may be hard-wired for configuration. Transceiver 210 has a terminal H/F that is biased according to the desired half-duplex or full-duplex operating mode. In this example, each terminal H/F of each transceiver 210 in network 200 is biased to a high logic level (e.g., power supply voltage $V_{IO}$) to configure half-duplex operation. For full-duplex operation, terminals H/F are biased to a low logic level (e.g., system ground).

Terminal TERM_TX of each transceiver 210 is biased to indicate whether that particular transceiver is coupled at an end of serial bus 205 or is coupled to bus 205 at an intermediate point between its ends. In the example of FIG. 2, transceivers 210(1) and 210(4) are coupled at the ends of serial bus 205, and are configured as such by their terminals TERM_TX receiving a high logic level (e.g., power supply voltage $V_{IO}$). The high level bias of terminals TERM_TX enables internal termination resistor 215 in each of end transceivers 210(1) and 210(4). Transceivers 210(2) and 210(3), on the other hand, are coupled at intermediate points along serial bus 205, and are configured as such by their terminals TERM_TX being biased to ground. Internal termination resistors (if present) are not enabled in these interior transceivers 210(2) and 210(3).

Figure 3:
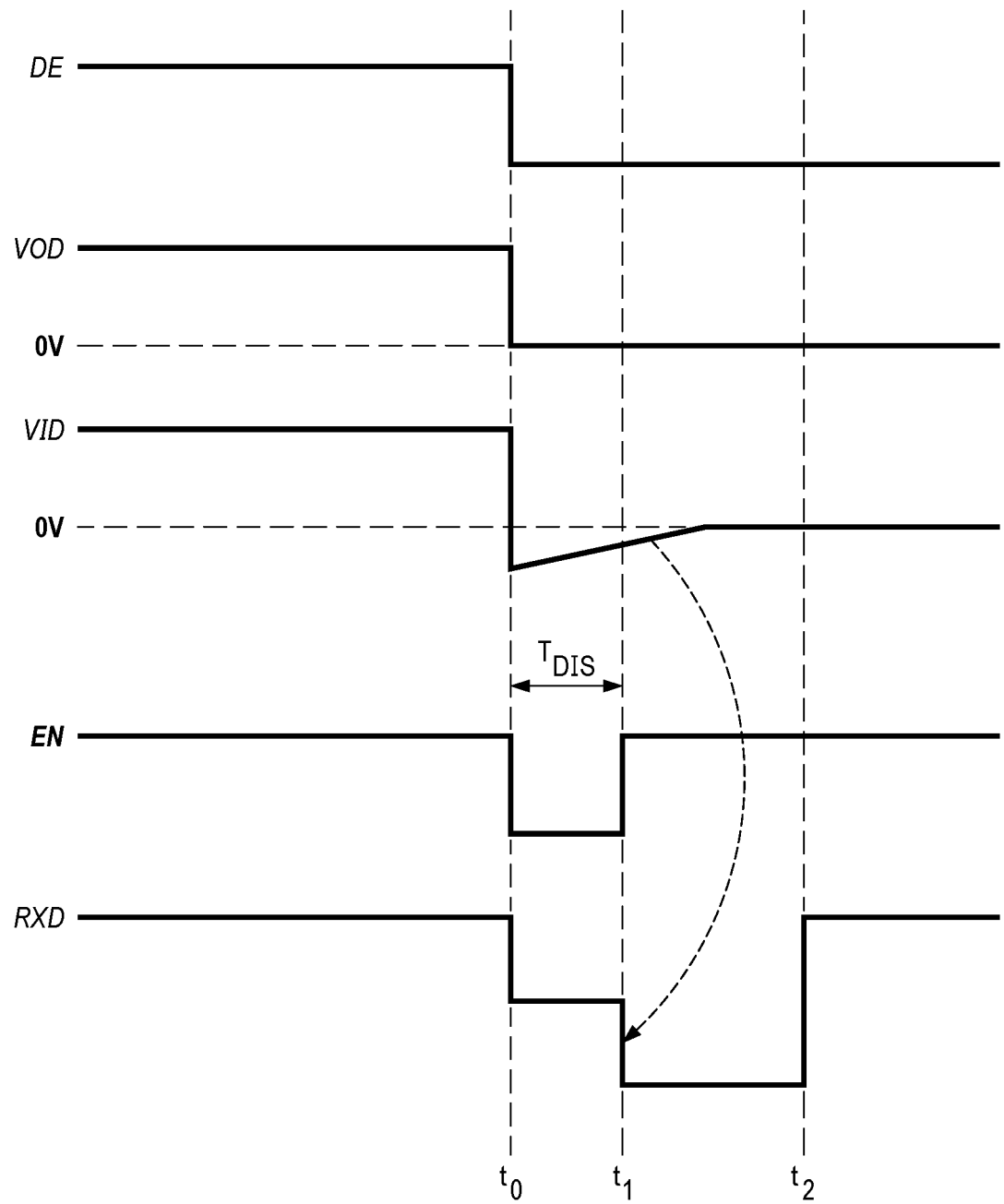
FIG. 3 is a timing diagram of an example of a receiver output "glitch" occurring in response to disabling of transmitter driver circuitry.

As noted above relative to FIG. 1, noise resulting from the disabling of transmitter circuitry in prior art transceiver circuits can propagate through the receiver circuitry to produce a false output level. FIG. 3 illustrates an example of this "glitch" in connection with prior art receiver circuitry 100 of FIG. 1.

Figure 1:
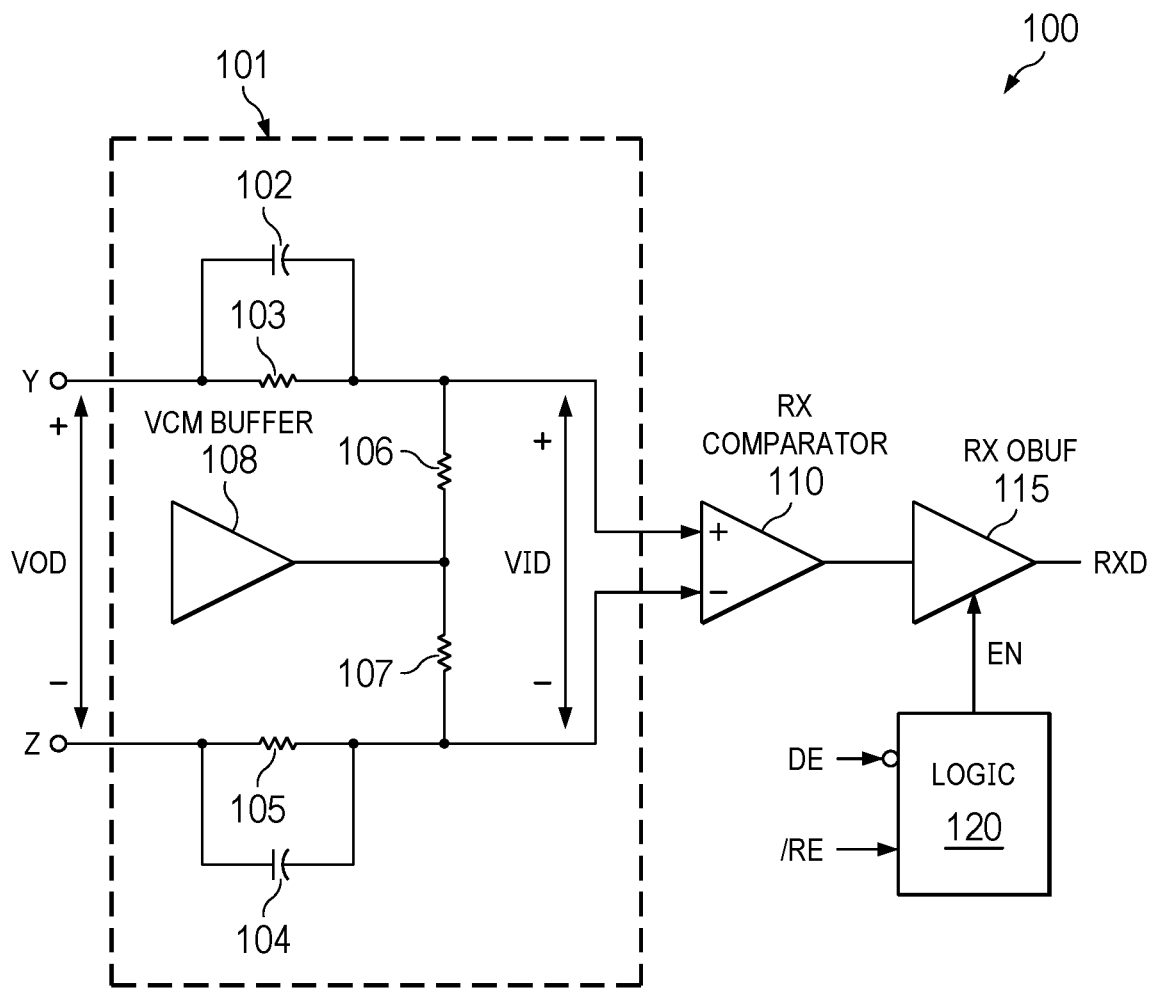
FIG. 1 is an electrical diagram, in schematic form, of a prior art differential receiver.

Prior to time $t_0$ in the example of FIG. 3, transmitter circuitry in the RS-485 transceiver including receiver circuitry 100 of FIG. 1 is enabled by driver enable signal DE at a high logic level. In this example, the transmitter is driving a high logic level onto bus line Y and a low logic level onto bus line Z, resulting in a positive differential voltage VOD appearing at the input of attenuator 101 in receiver circuitry 100. In turn, a positive differential voltage VID appears at the output of attenuator 101 and thus at the input of receiver comparator 110, resulting in a high logic level at output RXD of receiver output buffer 115. During this time, receiver output buffer 115 is enabled by the high logic level at receiver enable EN in response to receiver enable signal /RE at a low logic level.

At time $t_0$, driver enable signal DE makes a high-to-low transition to disable the transmitter circuitry. For example, output driver circuitry in the transmitter circuitry may be placed into a high-impedance state. In response to the disabling of this transmitter driver circuitry, the input differential voltage VOD at terminals Y and Z decays to a 0V differential, typically through termination resistors in the transceivers at ends of the RS-485 bus. This decay of input differential voltage VOD couples through capacitors 102 and 104 to appear at the inputs of receiver comparator 110 as a negative polarity differential voltage VID beginning at time $t_0$. This negative differential voltage VID decays over time through the action of common mode buffer 108 and resistors 103, 106, 105, 107 of input differential attenuator 101. In prior art receiver circuitry 100, logic circuitry 120 responds to the transition of driver enable signal DE by disabling enable signal EN applied to receiver output buffer 115 for a specified duration, until time $t_1$ in this example. Between time $t_0$ and time $t_1$ as shown in FIG. 3, the disabling of receiver output buffer 115 places output RXD of output buffer 115 in a high-impedance state.

However, it has proven difficult to properly select the duration that receiver output buffer 115 is disabled following the transition of driver enable signal DE (e.g., the duration of the interval TDIS between times $t_0$ and $t_1$ in FIG. 3). More particularly, the prior art approach of FIG. 1 requires a good match of this interval TDIS to the time that common mode buffer 108 requires to settle the negative transient of differential voltage VID plus the propagation delay of comparator 110. The design of a proper interval TDIS, over variations in manufacturing parameters, power supply voltage, and temperature ("PVT"), has proven to be difficult. In the example of FIG. 3, the duration of interval TDIs is too short, such that a negative differential voltage VID remains at the input of comparator 110 at time $t_1$ when output buffer 115 is again enabled This remaining negative differential VID causes comparator 110 and output buffer 115 to issue a false low logic level pulse ("glitch") at output RXD.

Receiver circuitry 100 constructed as shown in FIG. 1 cannot be readily adapted to avoid this output glitch due to driver disabling, given the stringent specifications of modern RS-485 and other serial communications standards. Reducing the capacitance of capacitors 102 and 104 in input attenuator 101 reduces the coupling between terminals Y and Z and the differential inputs of comparator 110 and thus the amplitude of the negative differential VID. However, that capacitance reduction also slows the receiver response and thus limits the attainable data rate of the transceiver. Further, the tight datasheet timing specifications required for high data rates limit the maximum duration that output buffer 115 may be disabled (e.g., the length of interval TDIS). Accordingly, receiver circuitry such as that shown in FIG. 1 may not sufficiently mask the noise caused by transmitter driver disabling over the full range of PVT.

Figure 4:
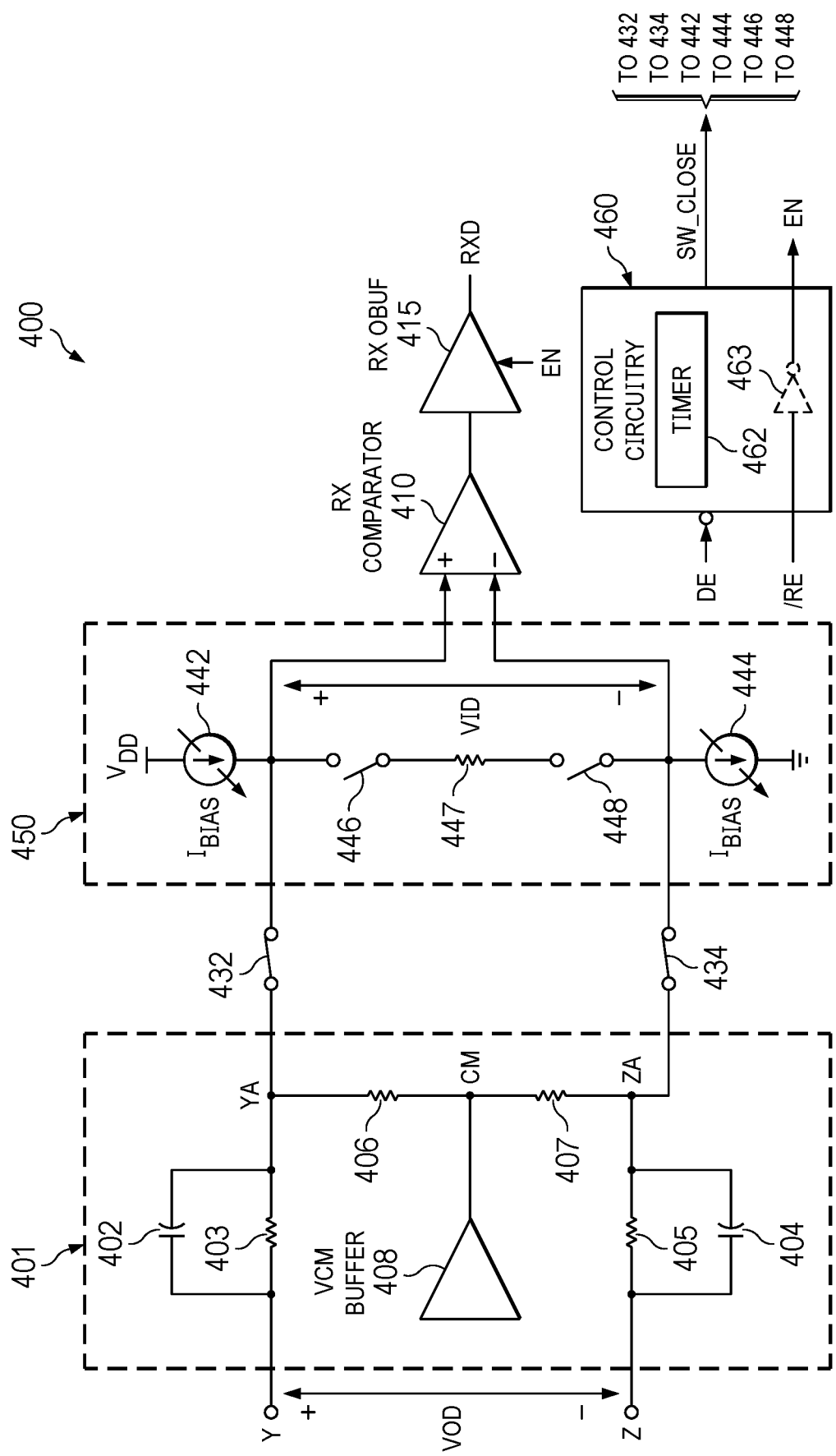
FIG. 4 is an electrical diagram, in block and schematic form, of receiver circuitry according to an example.

FIG. 4 illustrates receiver circuitry 400 according to an example. Receiver circuitry 400 includes input differential resistor ladder attenuator 401 (also referred to as an attenuator circuit), receiver comparator 410, and receiver output buffer 415. Attenuator 401 includes capacitors 402 and 404, resistors 403, 405, 406, and 407, and common mode buffer 408. This example of receiver circuitry 400 further includes switches 432 and 434, and fail-safe circuit 450. Fail safe circuit 450 includes current sources 442 and 444, switches 446 and 448, and resistor 447. Receiver circuitry 400 further includes control circuitry 460. Receiver circuitry 400 may be a stand-alone serial communications receiver device in a serial communications system, or may be implemented in an RS-485 or other serial communications transceiver. For example, receiver circuitry 400 of FIG. 4 may be used to implement receiver 212 in transceiver 210 of network 200 shown in FIG. 2.

In this example, attenuator 401 receives a differential input voltage VOD at terminals Y and Z of transceiver 200. Terminal Y is coupled to a passive network including capacitor 402 and resistor 403 in parallel. The parallel connection of capacitor 402 and resistor 403 is coupled to resistor 406 at node YA. Resistor 406 is coupled between node YA and an output of common mode buffer 408 at node CM. Similarly, terminal Z is coupled to a passive network including capacitor 404 and resistor 405 in parallel. This passive network of capacitor 404 and resistor 405 is coupled to resistor 407 at node ZA. Resistor 407 is coupled between node ZA and node CM at the output of common mode buffer 408. Common mode buffer 408 drives node CM to a common mode voltage to maintain the common mode voltage of nodes YA and ZA within a specified range over variations of common mode voltage range at differential input terminals Y and Z over its specified range. For example, common mode buffer 408 may drive a constant common mode voltage of 1.5V at node CM in order to keep the common mode voltage of nodes YA and ZA within a range of 1.1V to 1.9V, over variations in the common mode voltage at terminals Y and Z ranging from −7V to +12V. Common mode buffer 408 may have an input coupled to a resistor divider coupled between power supply or reference voltages (e.g., between a power supply voltage and ground).

Attenuator 401 establishes a differential voltage at nodes YA and ZA in response to the input differential voltage VOD at input terminals Y and Z. The differential voltage at nodes YA and ZA is attenuated from the input differential voltage VOD according to the relative resistances of resistors 403 and 406, and resistors 405 and 407, in the two resistor dividers of attenuator 401. Capacitors 402 and 404 couple high frequency components of the differential input signal VOD to nodes YA and ZA. The capacitances of capacitors 402 and 404 are selected according to bandwidth requirements for receiver circuitry 400.

Output nodes YA and ZA of attenuator 401 are coupled to switches 432 and 434, respectively. Switch 432 is coupled between output node YA of attenuator 401 and a positive input of comparator 410, and switch 434 is coupled between output node ZA of attenuator 401 and a negative input of comparator 410. In this arrangement, with switches 432, 434 closed, the attenuator output differential voltage at nodes YA, ZA appears at the inputs of comparator 410 as input differential voltage VID to comparator 410. Comparator 410 issues a logic level at its output in response to the polarity of its input differential voltage VID. For example, if input differential voltage VID has a positive polarity, comparator 410 may drive a high logic level at its output, and vice versa. The output of comparator 410 coupled to an input of receiver output buffer 415 which, when enabled in response to enable signal EN, has an output that provides a digital output signal RXD at a logic level in response to the output of comparator 410.

Fail-safe circuit 450 in this example includes current sources 442 and 444, switches 446 and 448, and resistor 447. Current source 442 is coupled between a power supply terminal (e.g., that receives a power supply voltage $V_{DD}$) and the positive input of comparator 410. Current source 444 is coupled between the negative input of comparator 410 and a reference voltage (e.g., circuit ground). Each of current sources 442 and 444 may be constructed as a field-effect transistor (e.g., metal-oxide-semiconductor (MOS) transistor) with its gate controlled by a reference voltage to conduct a regulated current $I_{BIAS}$. The reference voltages controlling current sources 442, 444 may be generated by an on-chip voltage reference generator or regulator, for example. Resistor 447 is coupled between switches 446 and 448 and has a resistance $R_{FS}$ selected to set the level of differential voltage VID (e.g., VID=$R_{FS} \cdot I_{BIAS}$) at the inputs of comparator 410 when switches 446, 448 are closed.

Switches 432, 434, 446, 448 may be constructed as pass transistors, for example complementary MOS transistors, with gates driven by control circuitry 460. Control circuitry 460 operates to open and close switches 432, 434, 446, 448 (e.g., by turning the pass transistors off and on) at the appropriate times in the transition of transceiver 210 from transmitting to receiving, as will be described below. Also in this example, current sources 442 and 444 may be selectively enabled and disabled by control circuitry 460, for example in cooperation with the state of switches 432, 434, 446, 448, as will also be described below.

Control circuitry 460 in this example may be constructed as digital or analog logic circuitry, for example according to a combinatorial or sequential logic arrangement, and configured to control the operation of switches 432, 434, 446, 448 and current sources 442, 444 to reduce "glitches" of receiver circuitry 400 due to noise at the differential input VOD, for example noise resulting from disabling of driver circuitry in the transmitter of this instance of receiver 200. As shown in FIG. 4, control circuitry 460 has an input (an inverting input in this example) receiving driver enable signal DE. Control circuitry 460 has one or more outputs at which it provides control signals to each of switches 432, 434, 446, 448 and current sources 442, 444. In the example of FIG. 4, control circuitry 460 is shown as controlling switches 432, 434, 446, 448 and current sources 442, 444 by control signal SW_CLOSE in response to a high-to-low transition of driver enable signal DE. Alternatively, control circuitry 460 may generate separate control signals switches 432, 434, 446, 448 and current sources 442, 444, which may be at different timing relative to one another. Control circuitry 460 may also include a timer 462 for controlling the durations of the control signals. For example, timer 462 may be programmable or otherwise controllable to allow external or user selection of the signal durations. Timer 462 may be implemented within control circuitry 460, or elsewhere within transceiver 210.

Control circuitry 460 also has an output that provides enable signal EN to a control input of output buffer 415. In this example, control circuitry 460 generates enable signal EN in response to receiver enable signal /RE (e.g., as the logical complement of receiver enable signal /RE, as shown by inverter 463). In this example, control circuitry 460 generates enable signal EN in response to receiver enable signal /RE, but not in response to driver enable signal DE.

Figure 5A:
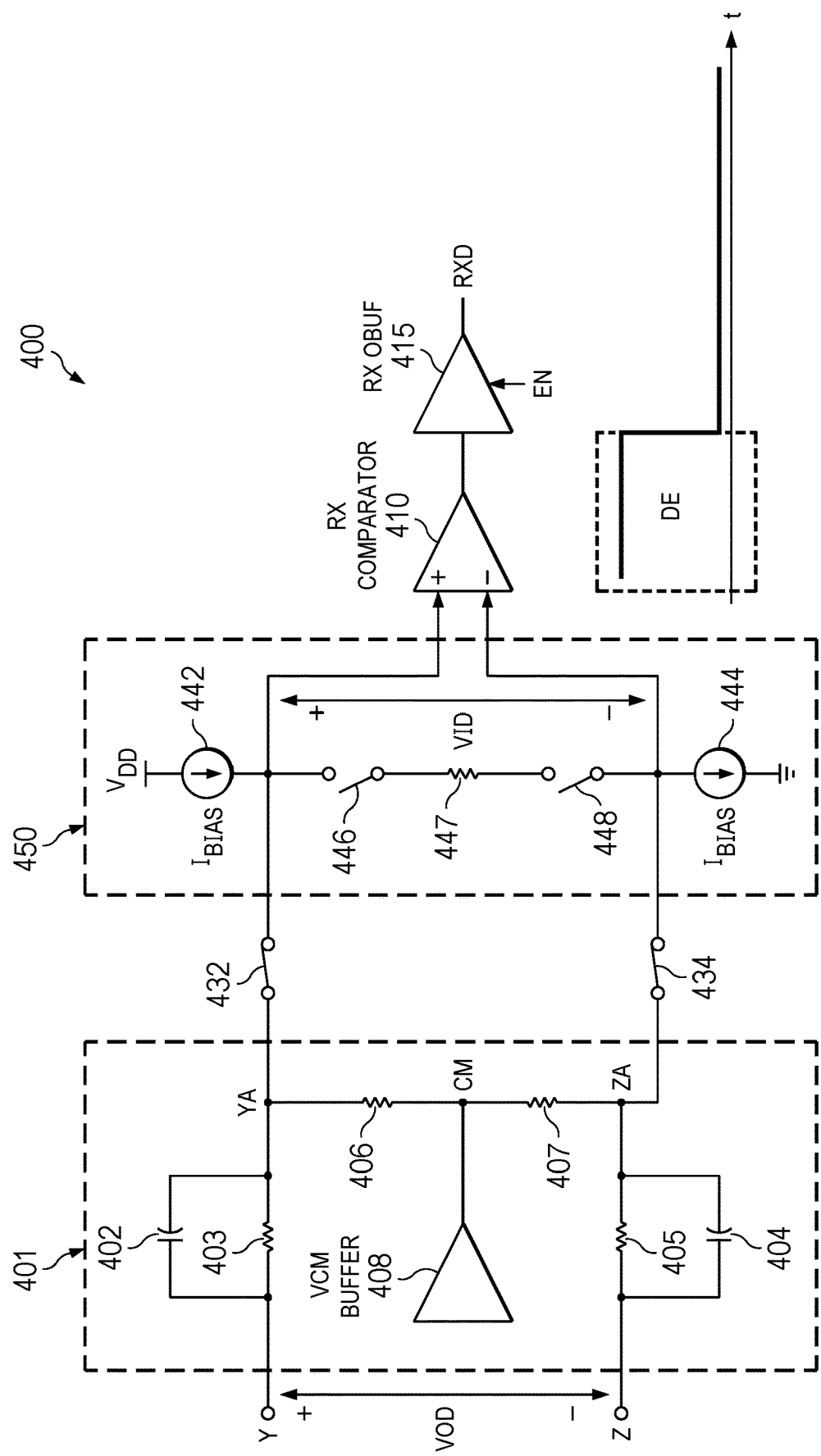
FIG. 5A, FIG. 5B, and FIG. 5C illustrate the example receiver circuitry of FIG. 4 as operating in different intervals following the disabling of transmitter driver circuitry.
Figure 5B:
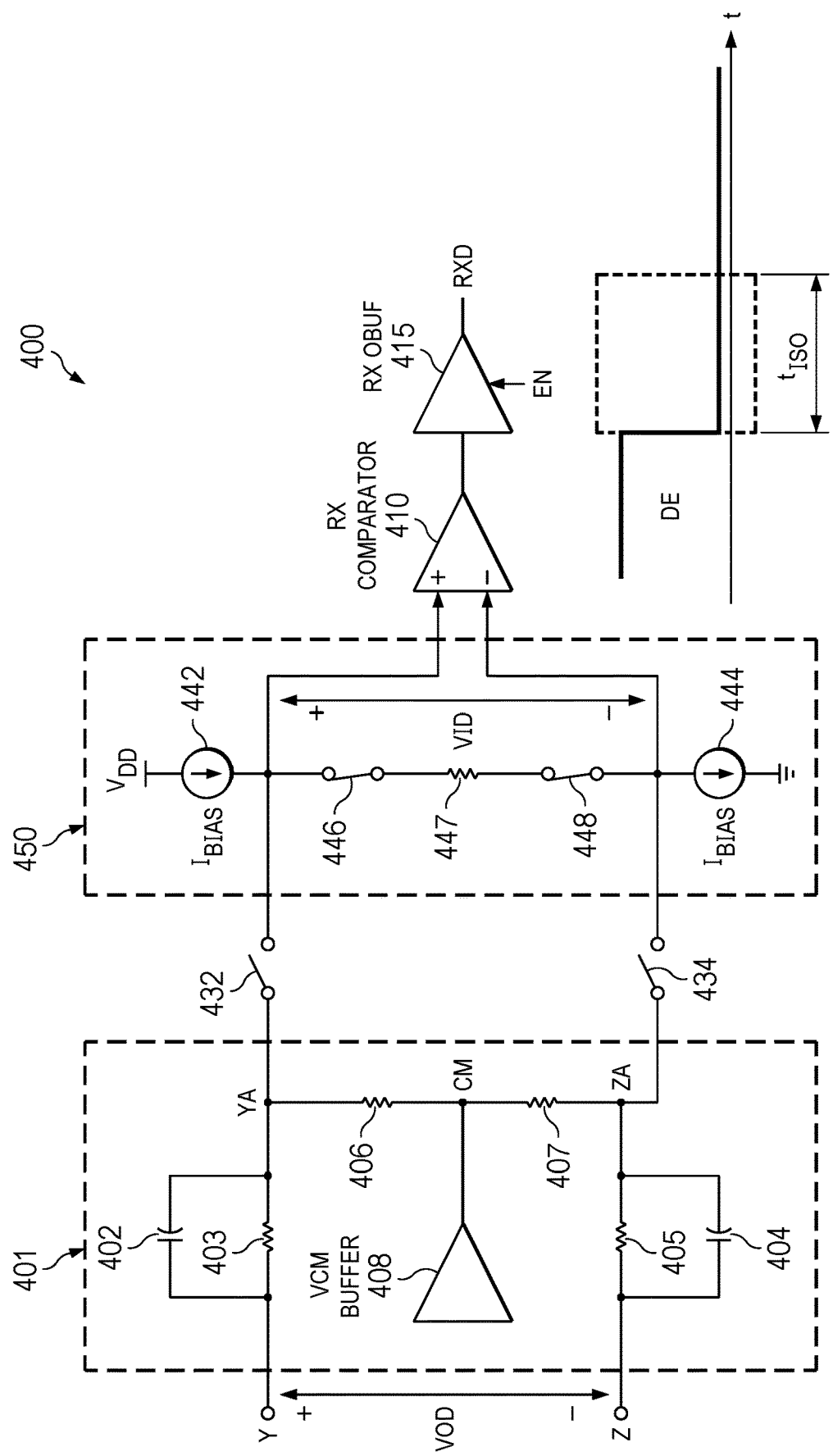
Figure 5C:
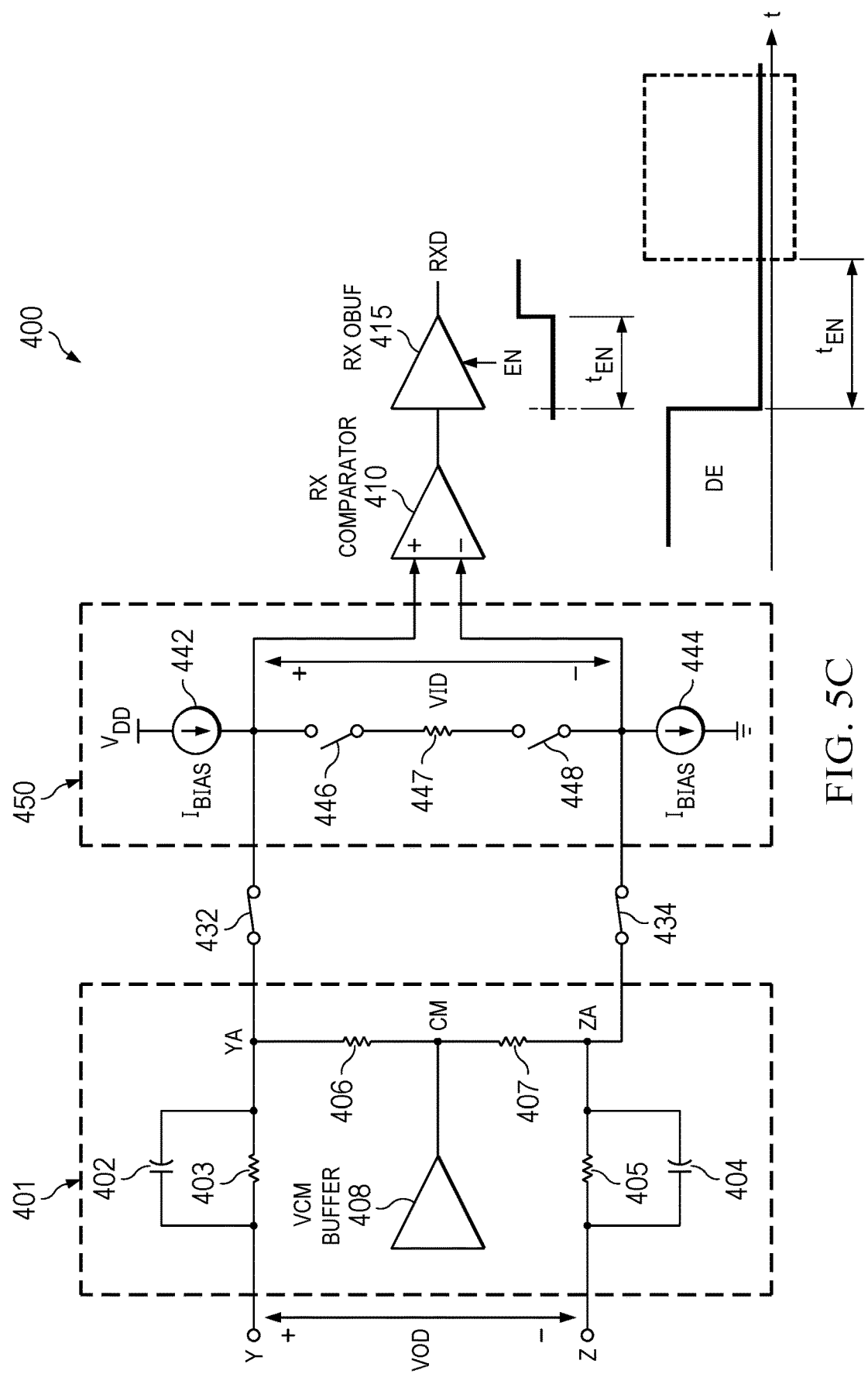

An example of the operation of receiver circuitry 400, including control circuitry 460 and its control of switches 432, 434, 446, 448 and current sources 442, 444, is illustrated in FIG. 5A through 5C.

FIG. 5A illustrates a state of receiver circuitry 400 during a time that driver enable signal DE is in an active state, for example during a transmit interval in which a transceiver (e.g., a transceiver 210) including receiver circuitry 400 is transmitting in a half-duplex mode. As before, terminals Y and Z are coupled to bus lines Y and Z, and thus receive the differential voltage VOD at those bus lines. During this time, while driver enable signal DE is enabling transmission, control circuitry 460 closes switches 432 and 434, which couples output nodes YA, YZ from attenuator 401 to the differential input of comparator 410. Also during this time, control circuitry 460 disables current sources 442 and 444, and opens switches 446, 448, so that fail-safe circuit 450 has no effect on the differential input voltage VID at comparator 410. Control circuitry 460 enables output buffer 415 by holding enable signal EN at a high logic level in response to receiver enable signal /RE at a low logic level at this time.

FIG. 5B illustrates a state of receiver circuitry 400 initially following a high-to-low transition of driver enable signal DE. As described above, this transition of driver enable signal DE disables transmission onto bus 205, for example from transmitter circuitry in the same transceiver as that including receiver circuitry 400. In response to the high-to-low transition of driver enable signal DE, control circuitry 460 issues control signal SW_CLOSE (FIG. 4), for a selected interval $t_{ISO}$, to switches 432, 434, 446, 448 and current sources 442, 444 to place receiver circuitry 400 in the state illustrated in FIG. 5B. In this example, the duration of interval $t_{ISO}$ is selected to be shorter than a specified time $t_{EN}$ following the transition of driver enable signal DE at which (e.g., according to the applicable specification) valid data is to present at terminal RXD. During the interval $t_{ISO}$, as shown in FIG. 5B, switches 432 and 434 are open so that the attenuated differential voltage at output nodes YA, YZ is blocked from propagating to the inputs of comparator 410.

Also during the interval $t_{ISO}$, current sources 442, 444 in fail-safe circuit 450 are enabled, and switches 446, 448 are closed. This causes fail-safe circuit 450 to conduct current $I_{BIAS}$ and establish a "fail-safe" voltage (e.g., corresponding substantially to $R_{ES} \cdot I_{BIAS}$) as differential voltage VID at the differential input of comparator 410. In this example, the fail-safe voltage is a small positive voltage (e.g., on the order of +50 mV). Accordingly, any transient or noise at bus lines Y and Z due to the high-to-low transition of driver enable signal DE will not appear at the input to comparator 410 during isolation interval $t_{ISO}$, and comparator 410 will be held at a stable state, preventing spurious transitions. Enable signal EN to receiver output buffer 415 remains active (at a high level) during this time because receiver enable signal /RE remains active (at a low level), and output buffer 415 maintains a high logic level at terminal RXD.

FIG. 5C illustrates a state of receiver circuitry 400 after the elapse of the interval $t_{EN}$ following the high-to-low transition of driver enable signal DE, at which time output buffer 415 is expected to present valid data (e.g., according to the operative specification). In this example, interval $t_{ISO}$ during which output nodes YA, YZ from attenuator 401 are decoupled from the differential input of comparator 410 is selected to be shorter than the specified interval $t_{EN}$. As shown in FIG. 5C, following the elapse of interval $t_{ISO}$, control circuitry 460 closes switches 432 and 434 to couple the output nodes YA, YZ from attenuator 401 to the differential input of comparator 410. In addition, fail-safe circuit 450 is disabled after interval $t_{ISO}$, by control circuitry 460 disabling current sources 442, 444 and opening switches 446, 448. Comparator 410 can, thus, respond to the differential voltage VOD at terminals Y and Z, and output buffer 415 produces digital output RXD at a valid level in response to the output of comparator 410.

Figure 6:
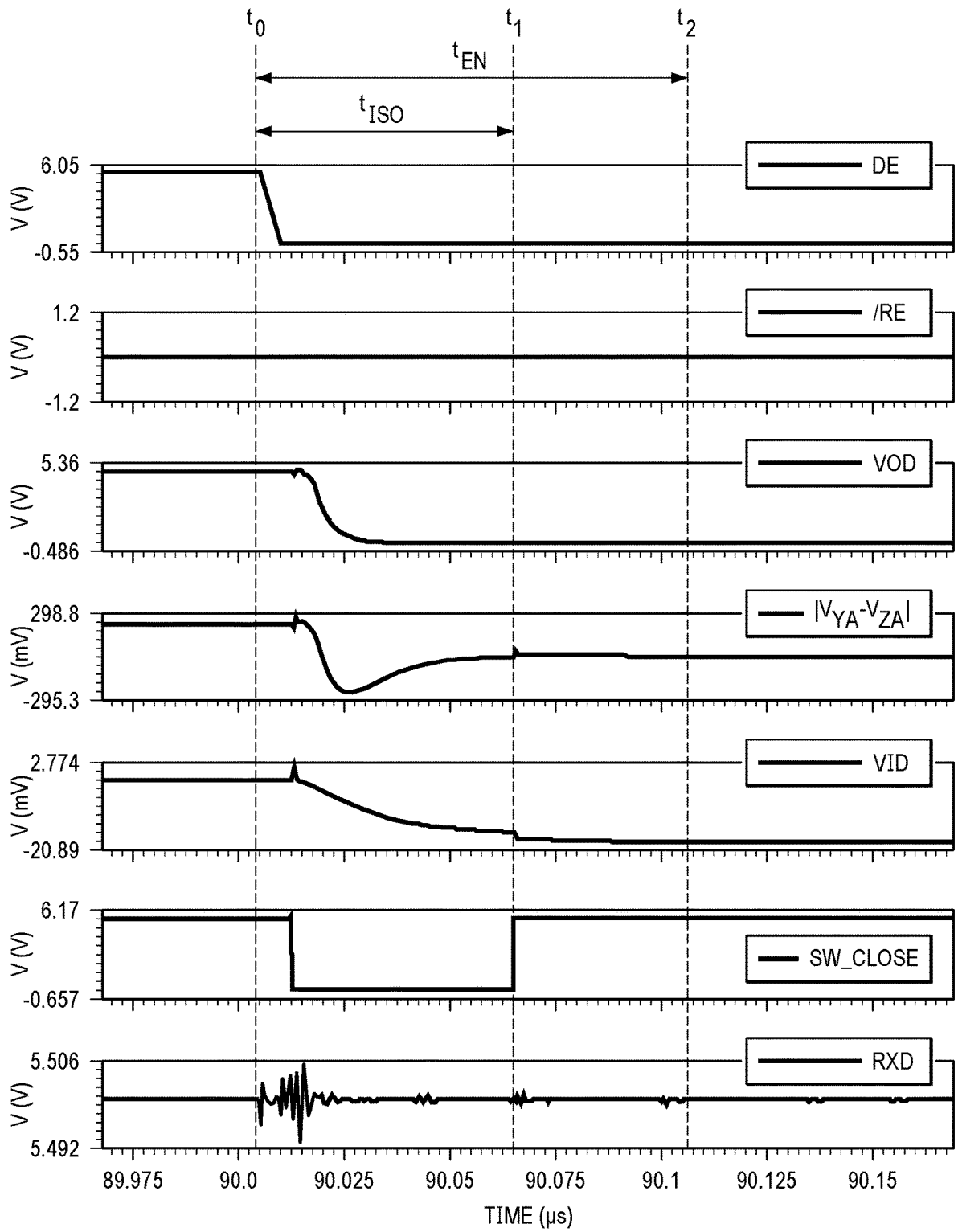
FIG. 6 is a timing diagram of an example of the operation of receiver circuitry of FIG. 4.

According to this example, the transient at bus lines Y, Z resulting from the disabling of driver enable signal DE is blocked from appearing at the input of comparator 410, thus preventing an undesired glitch at digital output RXD resulting from such transients. FIG. 6 illustrates an example of the operation of receiver circuitry 400 of FIG. 4 in response to the disabling of driver enable signal DE, as obtained from simulation, by way of a timing diagram. The timing diagram of FIG. 6 illustrates the relative timing of driver enable signal DE, receiver enable signal /RE, input differential voltage VOD, a differential voltage $|V_{YA}-V_{ZA}|$ at nodes YA, ZA, attenuated differential voltage VID, control signal SW_CLOSE, and output signal RXD.

Prior to time $t_0$ in the example of FIG. 6, driver enable signal DE is at a high logic level, which enables transmitter driver circuitry in transceiver 210. A positive polarity differential voltage VOD is established at bus lines Y, Z (e.g., by the transmitter driver circuitry of transceiver 210 itself), resulting in a non-zero differential voltage $|V_{YA}-V_{ZA}|$ at nodes YA, ZA. Because switches 432 and 434 are closed at this time prior to $t_0$ (FIG. 5A), a positive polarity differential voltage VID is applied to the differential input of comparator 410. During this transmitting interval, receiver enable signal /RE is at an active low level, such that control circuitry 460 is enabling receiver output buffer 415 via enable signal EN.

At time $t_0$, driver enable signal DE is driven to a low logic level to disable transmitter driver circuitry in transceiver 210. This disabling of driver circuitry causes the differential voltage VOD at terminals Y and Z to fall. Capacitors 402, 404 in attenuator 401 couple this decay of differential voltage VOD to nodes YA, ZA at the output of attenuator 401. Since capacitors 402, 404 in this example have significant capacitance (e.g., to attain the high data rate performance), the differential voltage $|V_{YA}-V_{ZA}|$ can go negative, as shown in FIG. 6 following time $t_0$. However, in response to the transition of driver enable signal DE, control circuitry 460 issues a low level pulse of control signal SW_CLOSE, opening switches 432 and 434 and thus decoupling nodes YA, ZA from the differential input of comparator 410. Accordingly, differential voltage VID does not fall with the movement of differential voltage $|V_{YA}-V_{ZA}|$ at the output of attenuator 401, but decays at a slower rate (e.g., according to the input capacitance etc. of comparator 410). The eventual voltage to which differential voltage VID decays is determined by fail-safe circuit 450, which is enabled in this interval to conduct current $I_{BIAS}$ through resistor 447 to establish a small positive fail-safe voltage $R_{FS} \cdot I_{BIAS}$ at the input of comparator 410 for the duration of the interval $t_{ISO}$. Because receiver enable signal /RE remains at a low logic level, receiver output buffer 415 outputs a high logic level at its output RXD in response to the positive fail-safe voltage at the inputs of comparator 410.

This interval $t_{ISO}$ elapses at time $t_1$ in FIG. 6. At this time, as described above relative to FIG. 5C, control circuitry 460 ends the low level pulse of control signal SW_CLOSE to close switches 432 and 434 and couple nodes YA and ZA to the differential input of comparator 410 (e.g., as differential voltage VID). The transition of control signal SW_CLOSE at time $t_1$ also disables fail-safe circuit 450 (e.g., switches 446 and 447 are opened, and current sources 442 and 444 are disabled), as shown in FIG. 5C. Receiver output buffer 415 remains enabled. Receiver output buffer 415 output RXD from output buffer 415 remains enabled, and has maintained its high logic level.

At time $t_2$, the interval $t_{EN}$ following the high-to-low transition of driver enable signal DE elapses. The host system or other downstream circuitry can assume the data level at terminal RXD to be valid.

Through the operation of receiver circuitry 400 according to this example, negative transitions resulting from the de-assertion of driver enable signal DE are prevented from causing spurious "glitches" from appearing at the digital output of receiver circuitry 400, as shown in FIG. 6. The prevention of these glitches according to this example can be attained over PVT, even at high data rates, by its decoupling of the input resistor ladder attenuator from the receiver comparator following the disabling of transmitter driver circuitry. As a result, propagation delay in the comparator is not a consideration in determining the duration that the receiver output buffer is disabled following driver disabling. Indeed, the duration (e.g., $t_{ISO}$) of this decoupling can be determined independently of the specified interval (e.g., $t_{EN}$) before valid data at the output buffer, providing an additional degree of freedom in the optimization of receiver performance. Furthermore, output glitches can be prevented according to this example without reducing the capacitance of the attenuator capacitors and the bandwidth of the receiver. High data rates can be supported by receiver circuitry according to this example, along with reliable inhibition of output glitches.

Figure 7:
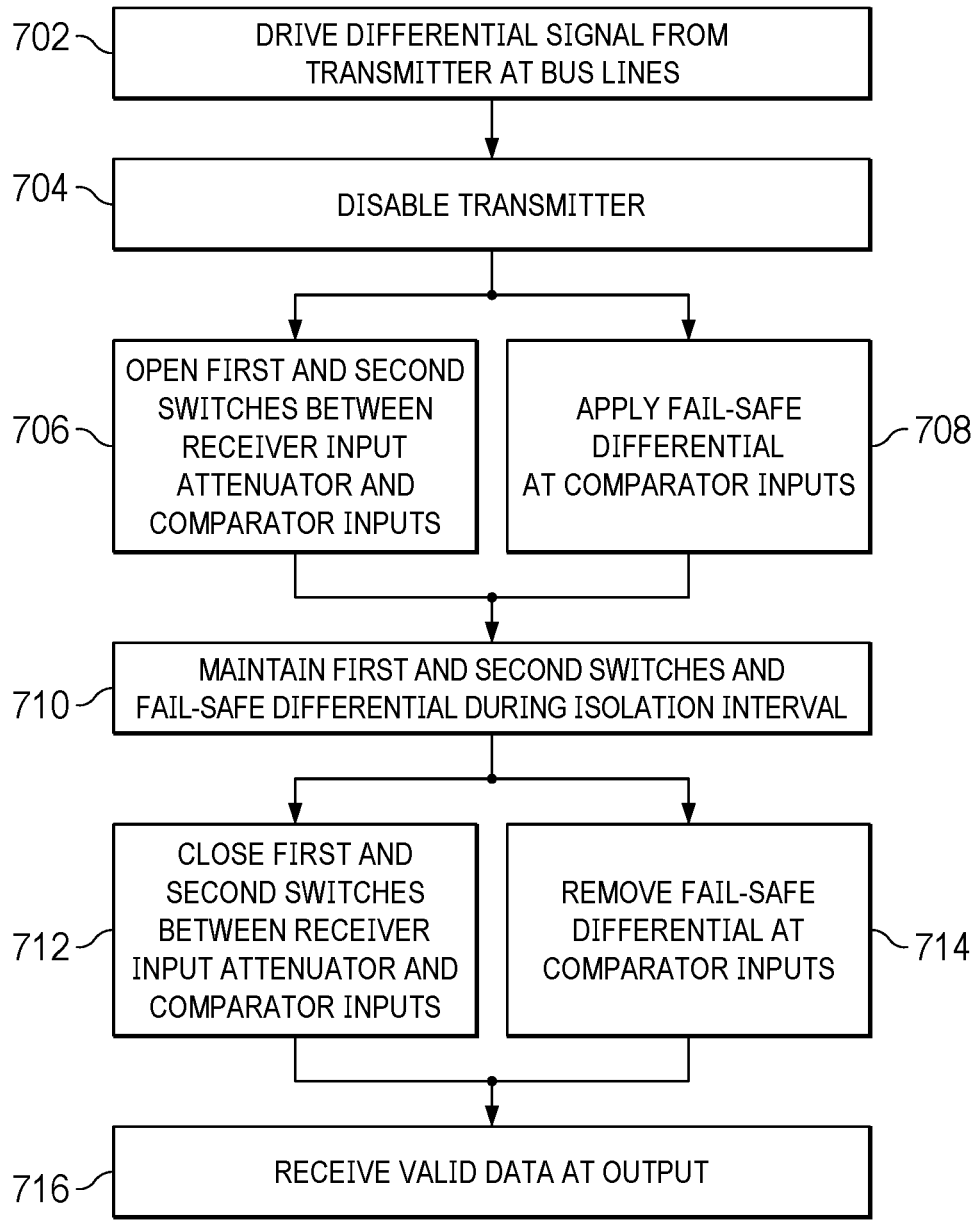
FIG. 7 is a flow diagram of a method of operating a transceiver according to an example.

FIG. 7 illustrates an example of a method of operating a serial communications transceiver, for example transceiver 210 in a half-duplex serial communications network such as shown in FIG. 2 and including receiver circuitry 400 according to the example of FIG. 4. The method corresponds to blocks 702-716 described herein as processes 702-716, each of which may correspond to one or more functions being performed by the transceiver 210 and/or the receiver 400.

This example method begins from process 702, in which transmitter circuitry 212 in the transceiver 210 is transmitting over signal bus 205. More particularly, transmitter circuitry 212 drives or provides a differential signal to the bus lines of bus 205. During the transmit interval of process 702, control circuitry 460 in receiver circuitry 400 has closed switches 432 and 434 to couple output nodes YA, YZ from attenuator 401 to the differential input of comparator 410, and has disabled current sources 442 and 444, and opened switches 446, 448. As such, receiver circuitry 400 may be in the state described above relative to FIG. 5A during process 702. During this transmit interval, control circuitry 460 may also disable output buffer 415, for example by holding enable signal EN at a low logic level in response to driver enable signal DE remaining asserted.

In process 704, transceiver 210 disables its transmitter circuitry 212, for example in response to receiving a high-to-low transition of driver enable signal DE from its associated host system.

In response to the disabling of transmitter circuitry 212 in process 704 (e.g., in response to the high-to-low transition of driver enable signal DE), control circuitry 460 of receiver circuitry 400 executes processes 706 and 708. For receiver circuitry 400 of FIG. 4, process 706 decouples comparator 410 from attenuator 401, for example by control circuitry 460 issuing control signals to open switches 432 and 434. This decoupling blocks the attenuated differential voltage at output nodes YA, YZ from appearing at the inputs of comparator 410. Process 708 applies a fail-safe differential at inputs of comparator 410, for example by control circuitry 460 closing switches 446, 448 and enabling current sources 442, 444. Accordingly, fail-safe circuit 450 conducts current $I_{BIAS}$ through resistor 447, which establishes a "fail-safe" differential voltage (e.g., $R_{FS} \cdot I_{BIAS}$) at the inputs of comparator 410. Processes 706 and 708 thus place receiver circuitry 400 in the state described above relative to FIG. 5B. In process 710, this state is maintained for the duration of a set or selected isolation interval (e.g., an interval $t_{ISO}$). In this example, interval $t_{ISO}$ is selected to be shorter than the specified delay of valid data at output buffer 415 following a high-to-low transition of driver enable signal DE.

Following process 710, at the end of the isolation interval $t_{ISO}$, control circuitry 460 executes process 712 and 714. In process 712, the inputs of comparator 410 are coupled to the outputs of attenuator 401, for example by control circuitry 460 closing switches 432 and 434. In process 714, the fail-safe differential voltage established by fail-safe circuit 450 is removed from the differential inputs of comparator 410, for example by control circuitry 460 disabling current sources 442 and opening switches 446 and 448. Comparator 410 can then again respond to a differential voltage established at nodes YA, ZA by attenuator 401.

Following process 712 and 714, and after the elapse of an interval $t_{EN}$ following the high-to-low transition of driver enable signal DE, the host system or other downstream circuitry receives valid data from output terminal RXD of receiver circuitry 400. As described above, the isolation interval $t_{ISO}$ is selected (e.g., by setting timer 462) to be shorter than the valid data interval $t_{EN}$ from the transition of driver enable signal DE. As a result of process 716, receiver circuitry 400 of FIG. 4 is in the state described above relative to FIG. 5C.

As described above, the method of FIG. 7 according to this example inhibits negative transitions caused by the disabling of a transmitter in a serial communications transceiver from causing "glitches" at the receiver output. This result can be attained over a suitable range of process parameters, supply voltage, and temperature, and without unduly limiting the bandwidth and performance of the transceiver.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means+/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some examples, certain elements are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. Also, resistors, capacitors, current sources, may have first and second terminals. Switches may have first and second terminals and also a control terminal at which a control signal (e.g., from control logic) may be applied to open (disable) and close (enable) the switch.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

Modifications are possible in the described examples, and other examples are possible, within the scope of the claims.

What is claimed is:

1. A receiver circuit, comprising:
   an attenuator circuit having first and second inputs and first and second outputs, the attenuator circuit including a resistor network coupled to the first and second inputs and to the first and second outputs;
   a comparator having first and second inputs and an output;
   a buffer having an input coupled to the output of the comparator, and having an output;
   a first switch having a first terminal coupled to the first output of the attenuator circuit and a second terminal coupled to the first input of the comparator;
   a second switch having a first terminal coupled to the second output of the attenuator circuit and a second terminal coupled to the second input of the comparator; and
   a first current source coupled to the first input of the comparator;
   a second current source coupled to the second input of the comparator; and
   third and fourth switches coupled in series between the first and second current sources.

2. The receiver circuit of claim 1, wherein the buffer is a first buffer, and the attenuator circuit includes:
   a first capacitor and a first resistor coupled in parallel between the first input of the attenuator circuit and the first output of the attenuator circuit;
   a second capacitor and a second resistor coupled in parallel between the second input of the attenuator circuit and the second output of the attenuator circuit;

a second buffer having an output;
a third resistor having a first terminal coupled to the first output of the attenuator circuit and a second terminal coupled to the output of the second buffer; and
a fourth resistor having a first terminal coupled to the second output of the attenuator circuit and a second terminal coupled to the output of the second buffer.

3. The receiver circuit of claim 1, further comprising a resistor coupled between the third and fourth switches.

4. The receiver circuit of claim 1, further comprising:
control circuitry coupled to the first, second, third, and fourth switches and configured to open the first and second switches and close the third and fourth switches during an isolation interval following disabling of a driver circuit for a transmitter, and to close the first and second switches and open the third and fourth switches after the isolation interval.

5. The receiver circuit of claim 4, wherein the control circuitry is further coupled to the first and second current sources, and is further configured to enable the first and second current sources during the isolation interval, and disable the first and second current sources after the isolation interval.

6. The receiver circuit of claim 4, wherein the driver circuit is enabled and disabled responsive to a driver enable/disable signal;
and wherein the control circuitry is configured to open the first and second switches and close the third and fourth switches responsive to the driver enable/disable signal.

7. A method comprising:
disabling a transmitter of a transceiver;
for an isolation interval after disabling the transmitter:
decoupling a comparator of a receiver of the transceiver from outputs of an attenuator of the receiver; and
applying a differential voltage at inputs of the comparator; and
after the isolation interval:
coupling the inputs of the comparator to the outputs of the attenuator; and
removing the differential voltage from the inputs of the comparator.

8. The method of claim 7, further comprising:
after coupling the inputs of the comparator to the outputs of the attenuator and removing the differential voltage, receiving data signals at an output of a receiver output buffer coupled to an output of the comparator.

9. The method of claim 7, wherein decoupling the comparator from the outputs of the attenuator comprises:
opening a first switch coupled between a first output of the attenuator and a first input of the comparator; and
opening a second switch coupled between a second output of the attenuator and a second input of the comparator.

10. The method of claim 9, further comprising:
coupling a common mode voltage to the first and second outputs of the attenuator via first and second resistors, respectively.

11. The method of claim 7, wherein the inputs of the comparator comprises first and second inputs, wherein applying the differential voltage includes:
enabling a first current source coupled to the first input of the comparator;
enabling a second current source coupled to the second input of the comparator; and
closing third and fourth switches coupled in series with a resistor between the first and second inputs of the comparator.

12. The method of claim 11, wherein removing the differential voltage from the inputs of the comparator includes:
opening the third and fourth switches; and
disabling the first and second current sources.

13. The method of claim 7, further comprising:
before disabling the transmitter, providing a differential signal from the transmitter to first and second bus lines;
wherein an output stage of the receiver is disabled when providing the differential signal.

14. A network, comprising:
first and second bus lines;
transceivers coupled to the first and second bus lines, wherein a first transceiver of the transceivers comprises:
a transmitter coupled to first and second bus lines;
a receiver circuit, coupled to the first and second bus lines, and including:
an attenuator circuit having first and second inputs and first and second outputs, the attenuator circuit including a resistor network coupled to the first and second inputs and to the first and second outputs;
a comparator having first and second inputs and an output;
a buffer having an input coupled to the output of the comparator, and having an output;
a first switch having a first terminal coupled to the first output of the attenuator circuit and a second terminal coupled to the first input of the comparator;
a second switch having a first terminal coupled to the second output of the attenuator circuit and a second terminal coupled to the second input of the comparator;
a first current source coupled to the first input of the comparator;
a second current source coupled to the second input of the comparator;
third and fourth switches coupled in series between the first and second current sources;
a resistor coupled between the third and fourth switches; and
control circuitry coupled to the first, second, third, and fourth switches and configured to open the first and second switches and close the third and fourth switches during an isolation interval following disabling of the transmitter, and configured to close the first and second switches and open the third and fourth switches after the isolation interval.

15. The network of claim 14, wherein the transmitter is enabled and disabled responsive to an enable signal;
and wherein the control circuitry is configured to open the first and second switches and close the third and fourth switches responsive to the enable signal.

16. The network of claim 14, wherein the control circuitry is further coupled to the first and second current sources, and is further configured to enable the first and second current sources during the isolation interval, and disable the first and second current sources after the isolation interval.

17. The network of claim 14, wherein the attenuator circuit includes:
a first capacitor and a first resistor coupled in parallel between the first input of the attenuator circuit and the first output of the attenuator circuit;
a second capacitor and a second resistor coupled in parallel between the second input of the attenuator circuit and the second output of the attenuator circuit;
a second buffer having an output;

a third resistor having a first terminal coupled to the first output of the attenuator circuit and a second terminal coupled to the output of the second buffer; and a fourth resistor having a first terminal coupled to the second output of the attenuator circuit and a second terminal coupled to the output of the second buffer.

18. The network of claim 14, wherein each of the transceivers is configured to transmit and receive signals on the first and second bus lines in half-duplex operation according to an RS-485 standard.

* * * * *